United States Patent [19]

Seta et al.

[11] Patent Number: 5,387,810
[45] Date of Patent: Feb. 7, 1995

[54] CELL LIBRARY FOR SEMICONDUCTOR INTEGRATED CIRCUIT DESIGN

[75] Inventors: Katsuhiro Seta, Tokyo; Hiroyuki Hara, Fujisawa, both of Japan

[73] Assignee: Kabushiki Kaisha Toshiba, Kawasaki, Japan

[21] Appl. No.: 699,628

[22] Filed: May 15, 1991

[30] Foreign Application Priority Data

May 24, 1990 [JP] Japan .................. 2-132497

[51] Int. Cl.⁶ .............. H01L 29/78; H01L 29/73
[52] U.S. Cl. .................. 257/370; 257/205; 257/206
[58] Field of Search ........... 357/43, 42, 45, 45.7; 307/446, 443, 415

[56] References Cited

U.S. PATENT DOCUMENTS 4,575,745  3/1986  Sharma et al. .................. 357/45
5,001,487  3/1991  Suzuki et al. .................. 357/43

FOREIGN PATENT DOCUMENTS 0189183  7/1986  European Pat. Off. .
58-27343  2/1983  Japan .
61-171150  8/1986  Japan .

OTHER PUBLICATIONS

"Proceedings of the IEEE 1990 Custom Integrated Circuits Conference" The Westin Copley Place Hotel, Boston, Mass., May 13–16, 1990.

*Primary Examiner*—Robert P. Limanek
*Assistant Examiner*—Wael Fahmy
*Attorney, Agent, or Firm*—Foley & Lardner

[57] ABSTRACT

A cell library for a semiconductor integrated circuit design, comprises a CMOS cell comprising two power source wires and a CMOS circuit placed between the two power source wires at a predetermined distance, and a BiCMOS cell comprising two power source wires which are placed at a distance equal to the distance between the power source wires in the CMOS cell, a CMOS circuit placed between the two power source wires in the BiCMOS cell, and bipolar transistor circuits placed at both outsides of the two power source wires in the BiCMOS cell.

9 Claims, 6 Drawing Sheets

FIG.2
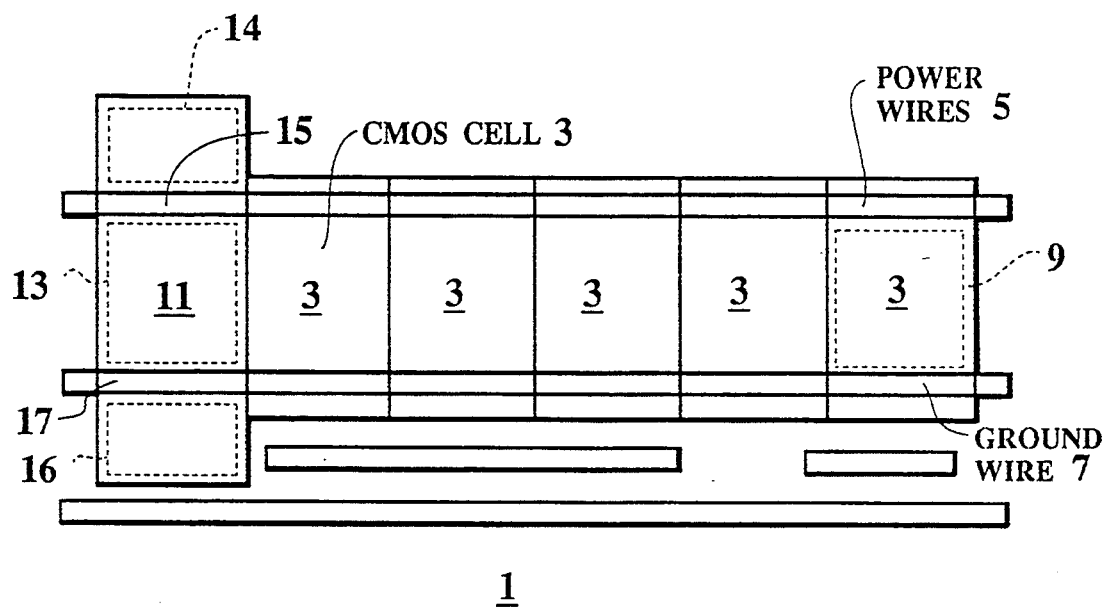
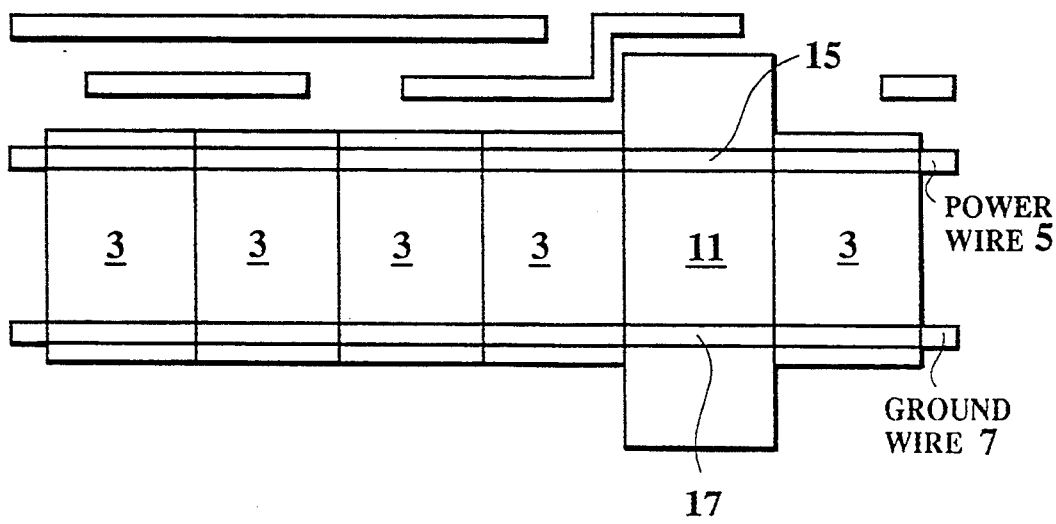

5,387,810

CELL LIBRARY FOR SEMICONDUCTOR INTEGRATED CIRCUIT DESIGN

BACKGROUND OF THE INVENTION

1. Field of the Invention

This invention relates to a cell library for a semiconductor integrated circuit design, more particularly cell library for a gate array or a standard cell arrangement including BiCMOS cells.

2. Description of the Prior Art

There are three types of conventional design methods for LSIs.

The first is the method wherein all processes, from positioning the elements to the wiring for a transistor or the like, are performed anew each time on a semiconductor substrate. This is known as the full custom method and exhibits the features of high performance and good efficiency in forming a small chip. On the other hand, this method has the drawback that development requires a long time and much labor.

The second method is the opposite of the first, in as much as the elements of the transistor or the like are provided in advance in the form of an array on the substrate of the semiconductor, already prepared as a wafer, and only the wiring between the elements must be decided, according to the application. This is referred to as the gate array method. The wiring for forming the necessary blocks (cells) to provide the various functions using this array is designed in advance and prepared in the form of a library. The designer combines the appropriate cells with reference to the library, and designs the intercell wiring. Following this, the actual wiring required with this method is extremely easy.

Intermediate to these two methods is the third method, known as the standard cell method. In this case, the arrangement of the elements and the wiring within one cell are designed as the optimum for each cell, and the designer, as a result, requires a shorter development period than for the full custom approach because only the combining of the cells and their inter-wiring need be performed. However, the arrangement of The cells on the semiconductor substrate from the stage of preparing the wafer is required, and more time is required to complete the LSI than for the gate array.

A conventional CMOS gate array or CMOS standard cell is illustrated in FIG. 1. A basic cell 101 is arranged to form a plurality of rows between which a wiring field 103 is interposed. A power source wiring 105 and a power source wiring 107 are formed on the upper and lower ends respectively of the individual cells, and the power wiring is connected automatically between the subjoining cells so that two series of power wiring 105 and 107 are formed, running through the respective rows.

In the development of conventional gate array or standard cells as described above, the utilization of the design method is limited to the circuitry around which the CMOS is centered. If a decision is made to use a circuit including a bipolar element (BiCMOS) as a gate array or standard cell, respectively, in the case where a bipolar element is incorporated in the cell, one cell becomes rather large in size. To add this cell with a bipolar element to a conventional library, certain steps are required. In the most common means considered, the design is modified to adapt each cell of a CMOS library to the BiCMOS size.

However, in this case the entire cell library must be rebuilt, which necessitates a great deal of time and trouble. Furthermore, separate administration of a library for CMOS use and a library for BiCMOS use becomes necessary, which is very inefficient.

SUMMARY OF THE INVENTION

An object of the present invention is to provide a cell library including CMOS cells, BiCMOS cells, and cells each of which has a CMOS cell and a BiCMOS cell for a semiconductor integrated circuit design.

The cell library for a semiconductor integrated circuit design according to one aspect of the present invention, comprises a CMOS cell comprising two power source wires and a CMOS circuit placed between the two power source wires at a predetermined distance, and a BiCMOS cell comprising two power source wires which are placed at a distance equal to the distance between the power source wires in the CMOS cell, a CMOS circuit placed between the two power source wires in the BiCMOS cell, and bipolar transistor circuits placed at both outsides of the two power source wires in the BiCMOS cell.

A cell library according to another aspect of the present invention comprises CMOS cell comprising two power source wires and a CMOS circuit placed between the two power source wires at a predetermined distance, BiCMOS a cell comprising two power source wires which are placed at a distance which is longer than the distance between the power source wires in the CMOS cell, a CMOS circuit placed between the two power source wires in the BiCMOS cell, and bipolar transistor circuits placed at both insides of the two power source wires in the BiCMOS cell, and two power source wires for connecting the two power source wires in the CMOS cell to the power source wires in the BiCMOS cell.

These and other objects, feature and advantages of the present invention will be more apparent from the following description of preferred embodiments, taken in conjunction with the accompanying drawings.

BRIEF DESCRIPTION OF THE DRAWINGS

FIG. 2 is a plan view of an integrated circuit in which a BiCMOS cell and a CMOS cell in a cell library according to the present invention are used;

DETAILED DESCRIPTION OF THE EMBODIMENTS

Figure 1:
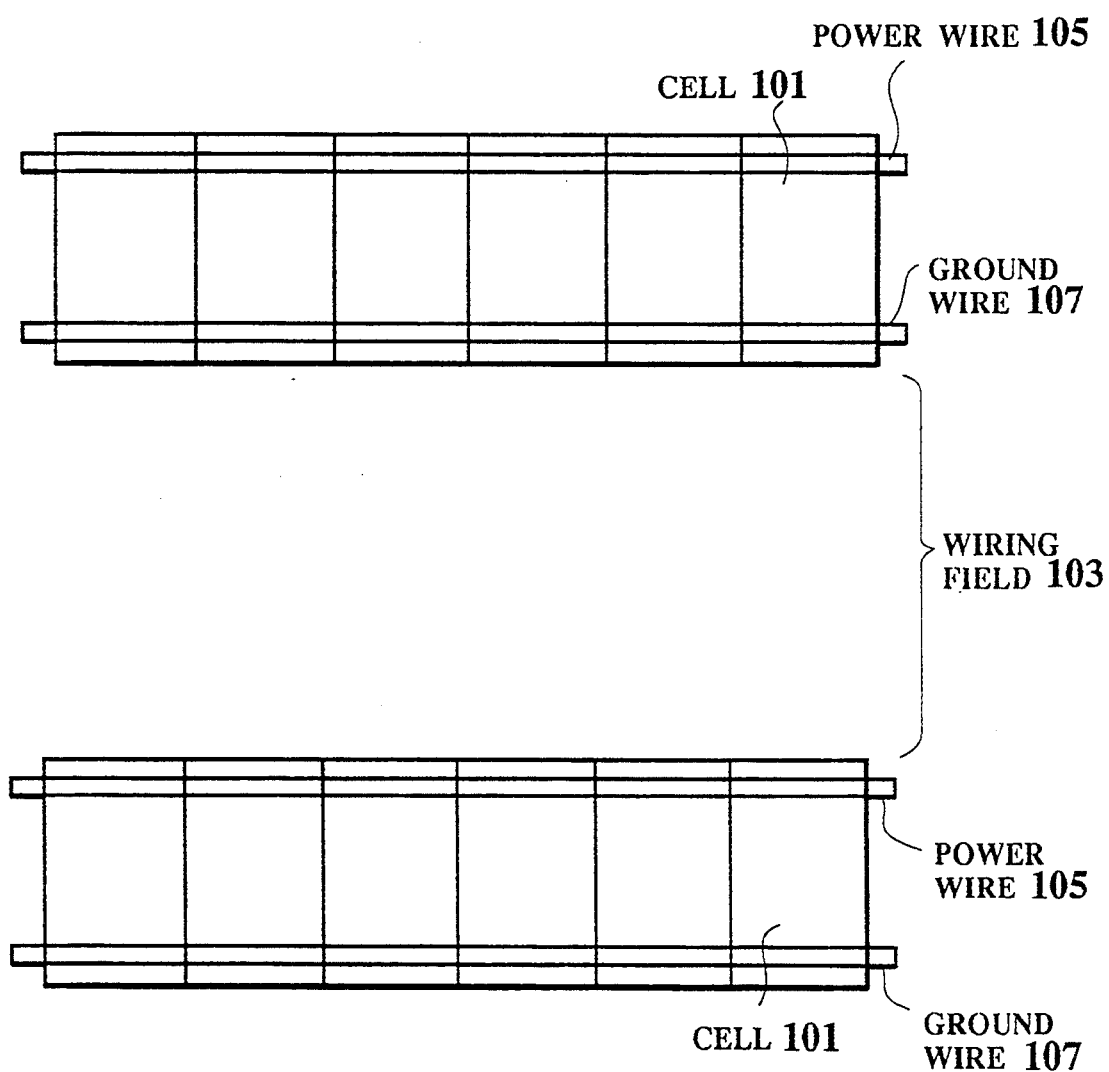
FIG. 1 is a plan view of a conventional integrated circuit in which conventional CMOS cells are used.

FIG. 2 illustrates the configuration of an integrated circuit using a cell library as a first embodiment of the present invention. This circuit can be applied in the case of both a gate array and a standard cell arrangement.

Specifically, in the case of a gate array, a plurality of elements methodically formed in rows on a semiconductor substrate 1 and the function of each cell is provided by then forming the appropriate wiring. In the case of a standard cell the arrangement of the elements on the semiconductor substrate is determined for each cell.

A plurality of CMOS cells 3 are provided. Each CMOS cell 3 comprises a 5 V power wire 5 and a 0 V power wire. specifically, a ground wire 7, and a CMOS circuit 9, formed between the power wire 5 and the ground wire 7. A BiCMOS cell 11 comprises a power wire 15, a ground wire 17, and a CMOS circuit 13 formed between the power wire 5 and the ground wire 17. In addition to these, bipolar transistor circuits 14 are provided external to the power wire 15 and the ground wire 17. All the power wires 15 and the ground wires 17 are formed at the same height so that if the CMOS cells 3 and the BiCMOS cell 11 are lined up in a row as shown in the drawing, the power wires 5 and 15 and the ground wires 7 and 17 are all formed running in common.

An interval between the adjacent cell rows is a wiring field to connect these cells. As can be clearly understood from the drawing, as compared to the case where CMOS cells only are formed, only the part of the BiCMOS cell which extends outside of the power wires and the ground wires (including bipolar transistor circuits 14, 16) infringes on the area of the wiring field. However, the circuit actually occupied by the BiCMOS is only about 10% of the total area, so this does not become a problem.

A specific example of the adaptation of a gate array known as a sea of gate array to the present invention will now be explained.

Figure 3:
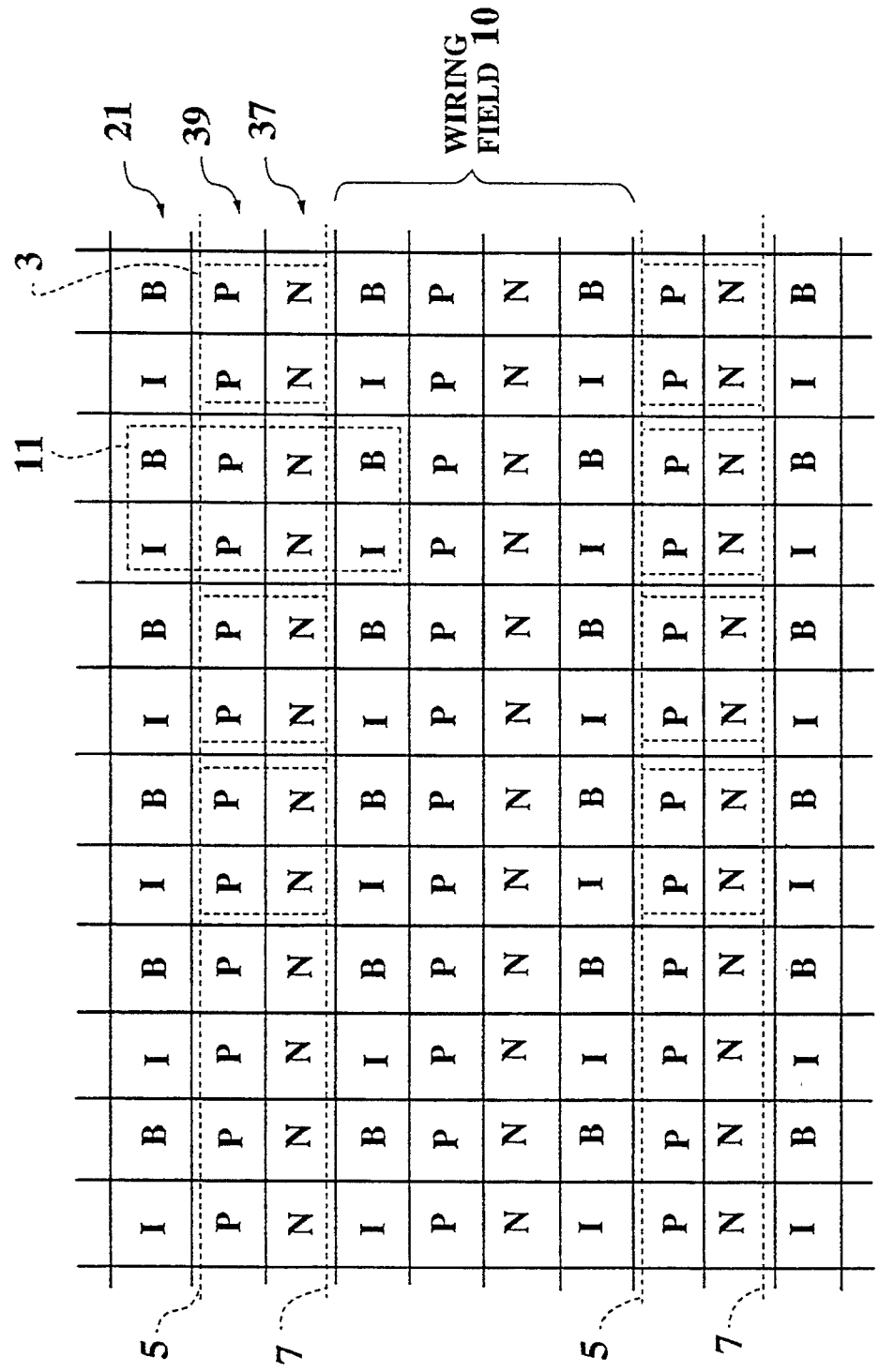
FIG. 3 is a plan view of a sea of gate array cells according to the present invention.

With this type of array, the elements are also formed in the wiring field 10. As shown in FIG. 3, the CMOS and the bipolar transistor and the like take up the entire semiconductor substrate. Specifically, a row 21 in which an NMOS row 37, a PMOS row 39, a bipolar transistor B, and a resistance I are lined up in that order and methodically repeated is formed. A PMOS transistor P, an NMOS transistor N, a bipolar transistor B, and a resistance I are respectively shown in FIG. 3. The same reference numerals are used for the power wires, the CMOS cell, and the BiCMOS cell as in FIG. 2.

Figure 4:
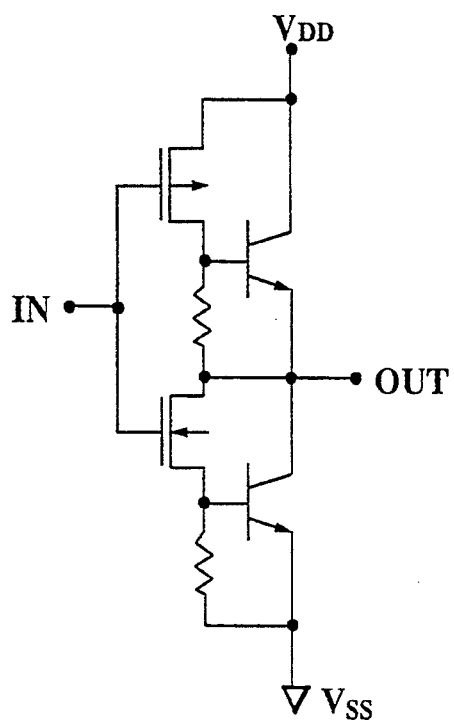
FIGS. 4 and 5 are circuit diagrams of a conventional inverter.
Figure 5:
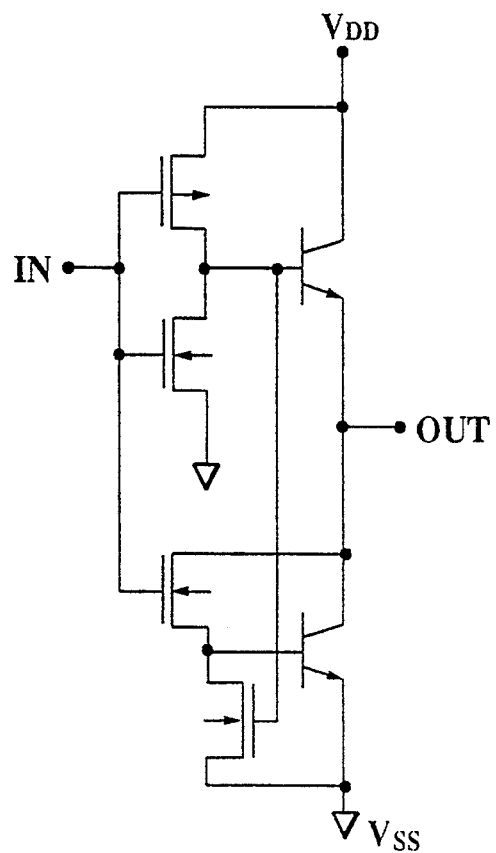

This type of cell library design can be applied where bipolar transistors are used on the output part OUT of a logic circuit such as shown in FIG. 4 and FIG. 5.

Figure 6:
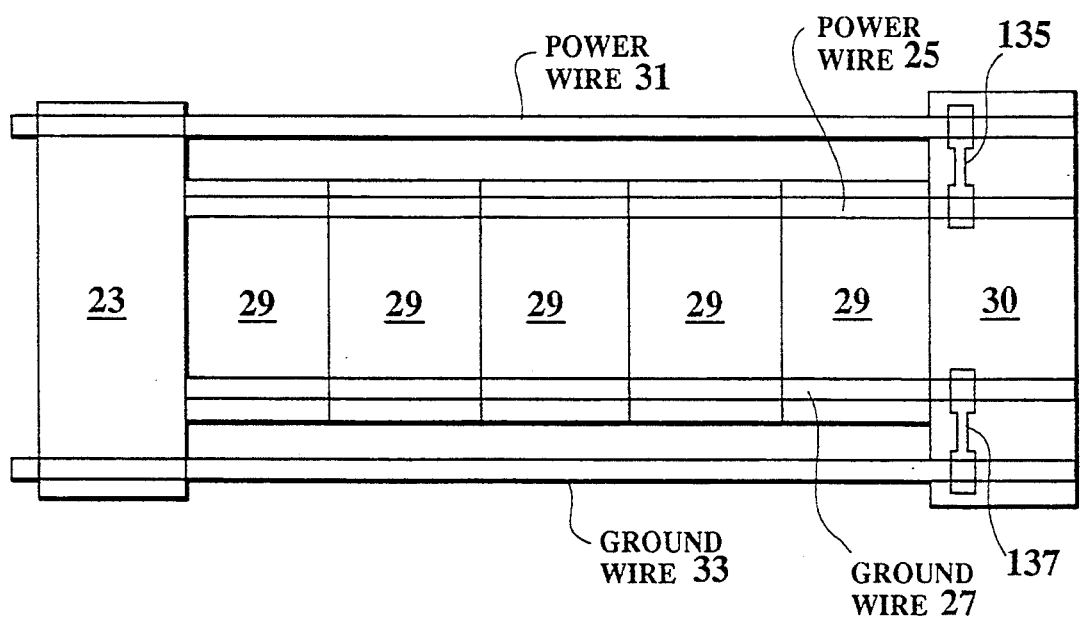
FIG. 6 is a plan view of an integrated circuit in which another type BiCMOS cell, CMOS cell, and a connecting cell in a cell library according to the present invention are used.

FIG. 6 shows a second embodiment of the present invention. Here, all the elements of a BiCMOS cell 23 are formed between a power wire 25 and a ground wire 27. In addition, a power wire 31 and a ground wire 33 are formed running completely on the outside of CMOS cell 29.

The power wire 25 can be connected to the power wire 31 and the ground wire 27 can be connected to the ground wire 33 by providing a connecting cell 30 having two connecting wires 135 and 137.

Figure 7:
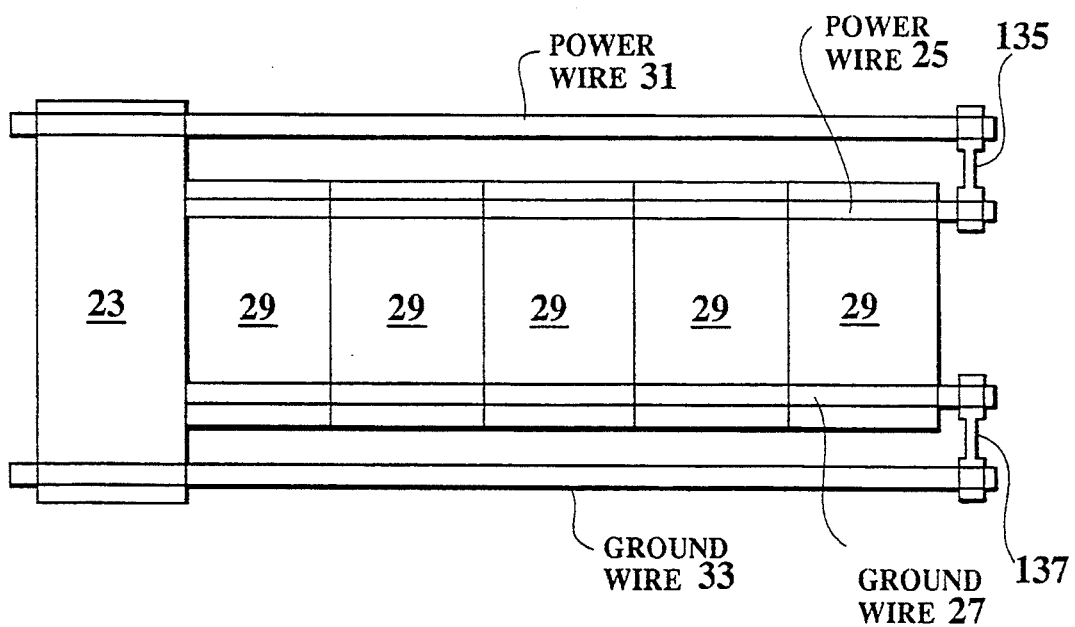
FIG. 7 is a plan view of an integrated circuit in which another type BiCMOS cell and CMOS cells in a cell library according to the present invention are used.

To obtain the same effect of the embodiment shown in FIG. 6, connecting wires 135 and 137 for connecting the wires 25 and 27 in the CMOS cell to the wires 31 and 33 in the BiCMOS cell can also be provided between the CMOS cell 29 and the BiCMOS cell 23 as shown in FIG. 7 instead of using the connecting cell 30 shown in FIG. 6.

Accordingly, in this case also the CMOS cell library of the present invention can be used without modification.

The preferred embodiments are explained in the foregoing discussion, but the present invention is not limited to these embodiments.

Various modification will become possible for those skilled in the art after receiving the teachings of the present disclosure without departing from the scope thereof.

What is claimed is:

1. A semiconductor integrated circuit, comprising:
   (a) a CMOS cell which includes
   (1) a pair of CMOS power source wires at a predetermined distance apart from each other, and
   (2) a CMOS circuit located between the pair of CMOS power source wires; and
   (b) a BiCMOS cell which includes
   a pair of BiCMOS power source wires at a predetermined distance apart from each other, the distance between the pair of BiCMOS power source wires being equal to the distance between the pair of CMOS power source wires, and wherein a CMOS portion is located between the pair of BiCMOS power source wires, and a bipolar transistor portion is located at an external side of the pair of BiCMOS power source wires.

2. A semiconductor integrated circuit according to claim 1, wherein a pair of bipolar transistor portions are located at both external sides of the pair of BiCMOS power source wires.

3. A semiconductor integrated circuit according to claim 1, wherein only one bipolar transistor portion is formed at only one external side of the pair of BiCMOS power source wires.

4. A semiconductor integrated circuit, comprising:
   (a) a CMOS cell which includes a pair of CMOS power source wires at a predetermined distance apart from each other with a CMOS circuit located between the pair of CMOS power source wires; and
   (b) a BiCMOS cell which includes a pair of BiCMOS power source wires at a predetermined distance apart from each other, the distance between the pair of BiCMOS power source wires being greater than the distance between the pair of CMOS power source wires, and wherein a CMOS portion and at least one bipolar transistor portion is located between the pair of BiCMOS power source wires; and
   wherein the pair of CMOS power source wires in the CMOS cell are connected to the pair of BiCMOS power source wires in the BiCMOS cell by a pair of connecting wires.

5. A semiconductor integrated circuit according to claim 4, wherein a pair of bipolar transistor portions are respectively located near the pair of BiCMOS power source wires.

6. A semiconductor integrated circuit according to claim 4, wherein only one bipolar transistor portion is located near the pair of BiCMOS power source wires.

7. A semiconductor integrated circuit, comprising:
   (a) a CMOS cell which includes
   1) a pair of CMOS power source wires at a predetermined distance apart from each other, and
   2) a CMOS circuit located between the pair of CMOS power source wires;

(b) a BiCMOS cell which includes a pair of BiCMOS power source wires at a predetermined distance apart from each other, the distance between the pair of BiCMOS power source wires being greater than the distance between the pair of CMOS power source wires, and wherein a CMOS portion and at least one bipolar transistor portion is located between the pair of BiCMOS power source wires; and (c) a connecting cell which includes a pair of first power source wires, the distance between them being the same as the distance between the pair of CMOS power source wires, a pair of second power source wires, the distance between them being the same as the distance between the pair of BiCMOS power source wires, and a pair of connecting wires connecting one of the first power source wires with one of the second power source wires, and the other connecting wire connecting the other of the first power source wires with the other of the second power source wires, wherein the CMOS power source wires and the BiCMOS power source wires are connected using the pair of connecting wires in the connecting cell.

8. A semiconductor integrated circuit according to claim 7, wherein a pair of bipolar transistor portions are located near the pair of BiCMOS power source wires.

9. A semiconductor integrated circuit according to claim 7, wherein only one bipolar transistor portion is located near the pair of BiCMOS power source wires.

* * * * *